(12) United States Patent
Morii

(10) Patent No.: US 11,218,129 B2
(45) Date of Patent: Jan. 4, 2022

(54) IMPEDANCE MATCHING DEVICE AND IMPEDANCE MATCHING METHOD

(71) Applicant: DAIHEN Corporation, Osaka (JP)

(72) Inventor: Tatsuya Morii, Osaka (JP)

(73) Assignee: DAIHEN Corporation, Osaka (JP)

( * ) Notice: Subject to any disclaimer, the term of this patent is extended or adjusted under 35 U.S.C. 154(b) by 60 days.

(21) Appl. No.: 16/719,343

(22) Filed: Dec. 18, 2019

(65) Prior Publication Data

US 2020/0212868 A1  Jul. 2, 2020

(30) Foreign Application Priority Data

Dec. 26, 2018 (JP) .............................. JP2018-243191

(51) Int. Cl.
*H03H 7/38* (2006.01)
*H01J 37/32* (2006.01)

(52) U.S. Cl.
CPC ......... *H03H 7/38* (2013.01); *H01J 37/32183* (2013.01)

(58) Field of Classification Search
CPC ........................... H03H 7/38; H01K 37/32183
See application file for complete search history.

(56) References Cited

U.S. PATENT DOCUMENTS

| | | | |
|---|---|---|---|
| 6,677,828 B1 | 1/2004 | Harnett et al. | |
| 7,251,121 B2 | 7/2007 | Bhutta | |
| 7,298,128 B2 | 11/2007 | Bhutta | |
| 9,196,459 B2 | 11/2015 | Bhutta | |
| 9,306,533 B1 | 4/2016 | Mavretic | |
| 9,345,122 B2 | 5/2016 | Bhutta | |
| 9,496,122 B1 | 11/2016 | Bhutta | |
| 9,525,412 B2 | 12/2016 | Mavretic | |
| 9,543,122 B2 | 1/2017 | Bhutta | |
| 9,584,090 B2 | 2/2017 | Mavretic | |
| 9,591,739 B2 | 3/2017 | Bhutta | |
| 9,697,991 B2 | 7/2017 | Bhutta | |
| 9,728,378 B2 | 8/2017 | Bhutta et al. | |
| 9,729,122 B2 | 8/2017 | Mavretic | |
| 9,745,660 B2 | 8/2017 | Bhutta | |

(Continued)

FOREIGN PATENT DOCUMENTS

| | | |
|---|---|---|
| JP | 2006-166412 A | 6/2006 |
| JP | 2010-103123 A | 5/2010 |

(Continued)

*Primary Examiner* — Samuel S Outten
(74) *Attorney, Agent, or Firm* — Rudy J. Ng; Bret E. Field; Bozicevic, Field & Francis LLP

(57) ABSTRACT

An impedance matching device 1 includes multiple capacitance elements and a control unit that controls on or off of semiconductor switches. The capacitance elements and respectively include a first capacitance element group and a second capacitance element group. The control unit updates the state of the first semiconductor switch included in the first capacitance element group with a first cycle until a predetermined time period elapses during which the state of the first semiconductor switch included in the first capacitance element group is maintained while the control unit updates the states of the semiconductor switch and respectively included in the first capacitance element group and the second capacitance element group with a second cycle longer than the first cycle after the predetermined time period elapses during which the state of the first semiconductor switch included in the first capacitance element group is maintained.

6 Claims, 8 Drawing Sheets

(56) References Cited

U.S. PATENT DOCUMENTS

| | | |
|---|---|---|
| 9,755,641 B1 | 9/2017 | Bhutta |
| 9,844,127 B2 | 12/2017 | Bhutta |
| 9,865,432 B1 | 1/2018 | Bhutta |
| 10,026,594 B2 | 7/2018 | Bhutta |
| 10,217,608 B2 | 2/2019 | Mavretic |
| 10,340,879 B2 | 7/2019 | Mavretic et al. |
| 10,431,424 B2 | 10/2019 | Mavretic et al. |
| 10,431,428 B2 | 10/2019 | Bhutta et al. |
| 10,454,453 B2 | 10/2019 | Bhutta et al. |
| 10,455,729 B2 | 10/2019 | Bhutta |
| 10,460,912 B2 | 10/2019 | Bhutta et al. |
| 10,483,090 B2 | 11/2019 | Bhutta et al. |
| 2006/0151591 A1 | 7/2006 | Matsuno |
| 2007/0170997 A1 | 7/2007 | Matsuno |
| 2008/0129407 A1 | 6/2008 | Matsuno |
| 2012/0168081 A1 | 7/2012 | Son |
| 2014/0354173 A1 | 12/2014 | Matsuno |
| 2016/0065207 A1 | 3/2016 | Bhutta |
| 2016/0380610 A1 | 12/2016 | Ulrich |
| 2017/0178865 A1 | 6/2017 | Ulrich |
| 2018/0076788 A1 | 3/2018 | Decker et al. |
| 2019/0172683 A1 | 6/2019 | Mavretic et al. |
| 2019/0267212 A1 | 8/2019 | Mavretic |
| 2019/0272978 A1 | 9/2019 | Ahmed et al. |
| 2019/0326094 A1 | 10/2019 | Bhutta |

FOREIGN PATENT DOCUMENTS

| | | |
|---|---|---|
| JP | 2012-142285 A | 7/2012 |
| JP | 2014-236435 A | 12/2014 |

FIG. 4

| | FIRST CAPACITANCE ELEMENT GROUP | | |
|---|---|---|---|
| 212 — HIGHER-ORDER BIT CAPACITOR | HC3 | HC2 | HC1 |
| 213 — CAPACITANCE(pF) | 16pF | 16pF | 16pF |
| HIGHER-ORDER BIT SWITCH | HS3 | HS2 | HS1 |

FIG. 5

| SECOND CAPACITANCE ELEMENT GROUP | | | | | |
|---|---|---|---|---|---|
| NUMBER OF DIGITS | 4 | 3 | 2 | 1 | |
| LOWER-ORDER BIT CAPACITOR | LC4 | LC3 | LC2 | LC1 | ⎫ 222 |
| CAPACITANCE(pF) | 8pF | 4pF | 2pF | 1pF | |
| LOWER-ORDER BIT SWITCH | LS4 | LS3 | LS2 | LS1 | ⎫ 223 |

IMPEDANCE MATCHING DEVICE AND IMPEDANCE MATCHING METHOD

CROSS-REFERENCE TO RELATED APPLICATION

This Non-provisional application claims priority under 35 U.S.C. § 119(a) on Patent Application No. 2018-243191 filed in Japan on Dec. 26, 2018, the entire contents of which are hereby incorporated by reference.

FILED

The present invention relates to an impedance matching device and an impedance matching method that achieve impedance matching between a high-frequency power source and a load.

BACKGROUND

An impedance matching device has been known that matches an output impedance of a high-frequency power source to an impedance viewed from the high-frequency power source toward a load side in order to eliminate reflected power from a load and efficiently supply power to the load when power is supplied from the high-frequency power source to the load such as a plasma load or the like (for example, refer to Japanese Patent application Laid-Open No. 2012-142285 as Patent Document 1).

The impedance matching device disclosed in Patent Document 1 includes a variable capacitor, and is provided between a high-frequency power source and a load. The variable capacitor disclosed in Patent Document 1 includes multiple capacitors connected in parallel to each other, and is configured to change the capacitance of the variable capacitor by performing switching control of turning on or off semiconductor switches (PIN diodes) connected in series to the respective capacitors. The impedance matching device disclosed in Patent Document 1 achieves impedance matching by changing the capacitance of the variable capacitor.

SUMMARY

However, in the case where high-frequency power is supplied to a load whose impedance frequently varies such as a plasma load, continuous updating of the states of the semiconductor switches for deciding the capacitance of the variable capacitor following the variation in the load impedance results in fast and continuous on-off operation of the semiconductor switches.

This operation raises a problem of increase in the amount of heat generated in the semiconductor switches due to switching loss.

It is an object of the present invention to provide an impedance matching device and an impedance matching method that are able to reduce the amount of heat generated in the semiconductor switches.

An impedance matching device according to one aspect of the present disclosure is an impedance matching device that is provided between a high-frequency power source and a load and that obtains information concerning an impedance viewed from an output terminal of the high-frequency power source or from an equivalent to the output terminal toward a load side to achieve impedance matching between the high-frequency power source and the load. The impedance matching device comprises: a variable capacitor including a plurality of capacitance elements respectively having capacitor each having one end connected to the high-frequency power source and respective semiconductor switch connected in series to the capacitor, the plurality of capacitance elements being connected in parallel; and a control unit that controls an on or off state of the semiconductor switches such that an impedance of the high-frequency power source is matched to an impedance of the load based on the information concerning the impedance obtained. The plurality of capacitance elements include a first capacitance element group and a second capacitance element group that includes the capacitors each having a capacitance smaller than a capacitance of one of the capacitors constituting the first capacitance element group. The control unit updates a state of the semiconductor switch included in the first capacitance element group with a first cycle until a predetermined time period elapses during which the state of the semiconductor switch included in the first capacitance element group is maintained after starting impedance matching operation between the high-frequency power source and the load, and updates a state of the semiconductor switch included in the first capacitance element group and a state of the semiconductor switch included in the second capacitance element group with a second cycle longer than the first cycle after the predetermined time period elapses during which the state of the semiconductor switch included in the first capacitance element group is maintained. Here, the part equivalent to the output terminal is the input terminal of the impedance matching device, for example.

In the present aspect, the first capacitance element group includes the capacitors each having a large capacitance, so that change of one capacitance causes great change in the impedance. Accordingly, during the unmatched state, rough adjustments are preferentially performed, so that an impedance is first adjusted by the first capacitance element group.

After the state of the semiconductor switch in the first capacitance element group is maintained for the predetermined time period (in the near-matched state), precise adjustments are required, so that the second capacitance element group is added to thereby adjust the impedance using the first capacitance element group and the second capacitance element group. The capacitors of the second capacitance element group having smaller capacitances than those of the capacitors constituting the first capacitance element group frequently repeat switching (updating the states of the semiconductor switches). The capacitor with particularly smaller capacitance performs switching highly frequently.

In contrast thereto, the first capacitance element group is switched with the first cycle until the predetermined time period elapses during which the state of the semiconductor switch in the first capacitance element group is maintained (in the unmatched state) while the first capacitance element group and the second capacitance element group are switched with the second cycle after the predetermined time period elapses during which the state of the semiconductor switch in the first capacitance element group is maintained (in the near-matched state), thereby updating the states of the semiconductor switches.

The second cycle is set to a cycle longer than the first cycle. Hence, after the predetermined time period elapses during which the state of the semiconductor switch in the first capacitance element group is maintained (in the near-matched state), the update cycle is extended to thereby reduce the heat generation caused by the switching of the second capacitance element group. It is noted that after the near-matched state, the state of the first capacitance element group is scarcely changed, which lessens the influence of the heat generation due to the switching of the first capacitance element group.

That is, after the predetermined time period elapses during which the state of the semiconductor switch in the first capacitance element group is maintained (in the near-matched state), the update cycle is extended to thereby reduce the switching loss caused by the semiconductor switch being turned on or off, preventing the temperatures of the semiconductor switch from rising. In contrast, until the predetermined time period elapses during which the state of the semiconductor switch in the first capacitance element group is maintained after starting of impedance matching operation, the semiconductor switch included in the first capacitance element group including the capacitor with a large capacitance is updated with the first cycle, and thus the targeted impedance matching point can be reached soon.

In the impedance matching device according to one aspect of the present disclosure, the first capacitance element group includes a plurality of the semiconductor switches, and the control unit updates states of the semiconductor switches included in the first capacitance element group with the first cycle in the case where states of two or more semiconductor switches out of the plurality of the semiconductor switches included in the first capacitance element group are changed during one updating after updating with the second cycle.

According to the present aspect, in the case where the states of two or more semiconductor switches out of the plurality of the semiconductor switches included in the first capacitance element group are changed, the impedance is far away from the targeted matching point. Accordingly, in the case where the states of two or more semiconductor switches included in the first capacitance element group are changed after updating with the second cycle, the control unit updates the states of the semiconductor switches included in the first capacitance element group with the first cycle, which allows the matching point to be achieved soon.

In the impedance matching device according to one aspect of the present disclosure, the second capacitance element group includes a plurality of the semiconductor switches, and the control unit maintains states of the semiconductor switches included in the second capacitance element group at a time of updating with the first cycle.

According to the present aspect, in the case of updating with the first cycle, the states of the semiconductor switches included in the second capacitance element group are maintained, which reduces the switching loss of the semiconductor switches included in the second capacitance element group, enabling reduction in the heat generation from the semiconductor switches.

In the impedance matching device according to one aspect of the present disclosure, the predetermined time period is a time period three times longer than the first cycle.

According to the present aspect, when the update cycle is updated from the first cycle to the second cycle, by setting the predetermined time period to a period three times longer than the first cycle, the update cycle can be changed to the second cycle after the impedance of the high-frequency power source and the impedance of the load are moderately close to the matched state.

In the impedance matching device according to one aspect of the present disclosure, a capacitance of any one of the capacitors included in the first capacitance element group is larger than a total value of capacitances of all the capacitors included in the second capacitance element group.

According to the present aspect, the capacitance of any one of the capacitors included in the first capacitance element group is larger than the total value of capacitances of all the capacitors included in the second capacitance element group. Accordingly, in the case where the capacitance required for the variable capacitor is larger than the total value of the capacitances of all the capacitors included in the second capacitance element group, this can be addressed by using the capacitors included in the first capacitance element group.

An impedance matching method according to one aspect of the present disclosure is an impedance matching method of achieving impedance matching between a high-frequency power source and a load by a variable capacitor provided between the high-frequency power source and the load, the variable capacitor including a first capacitance element group including a capacitor and a semiconductor switch and a second capacitance element group including a capacitor having a capacitance smaller than a capacitance of the capacitor of the first capacitance element group and a semiconductor switch. The impedance matching method comprises: updating a state of the semiconductor switch included in the first capacitance element group with a first cycle until a predetermined time period elapses during which the state of the semiconductor switch included in the first capacitance element group is maintained after starting of impedance matching operation between the high-frequency power source and the load, and updating a state of the semiconductor switch included in the first capacitance element group and a state of the semiconductor switch included in the second capacitance element group with a second cycle longer than the first cycle after the predetermined time period elapses during which the state of the semiconductor switch included in the first capacitance element group is maintained.

According to the present aspect, it is possible to provide the impedance matching method capable of reducing the amount of heat generated in the semiconductor switches.

It is possible to provide an impedance matching device and an impedance matching method that are able to reduce the amount of heat generated in the semiconductor switches.

The above and further objects and features will more fully be apparent from the following detailed description with accompanying drawings.

BRIEF DESCRIPTION OF THE DRAWINGS

FIG. 4 is an illustrative view of a first capacitance element group.

FIG. 5 is an illustrative view of a second capacitance element group.

MODE FOR CARRYING OUT INVENTION

Embodiment 1

Figure 1:
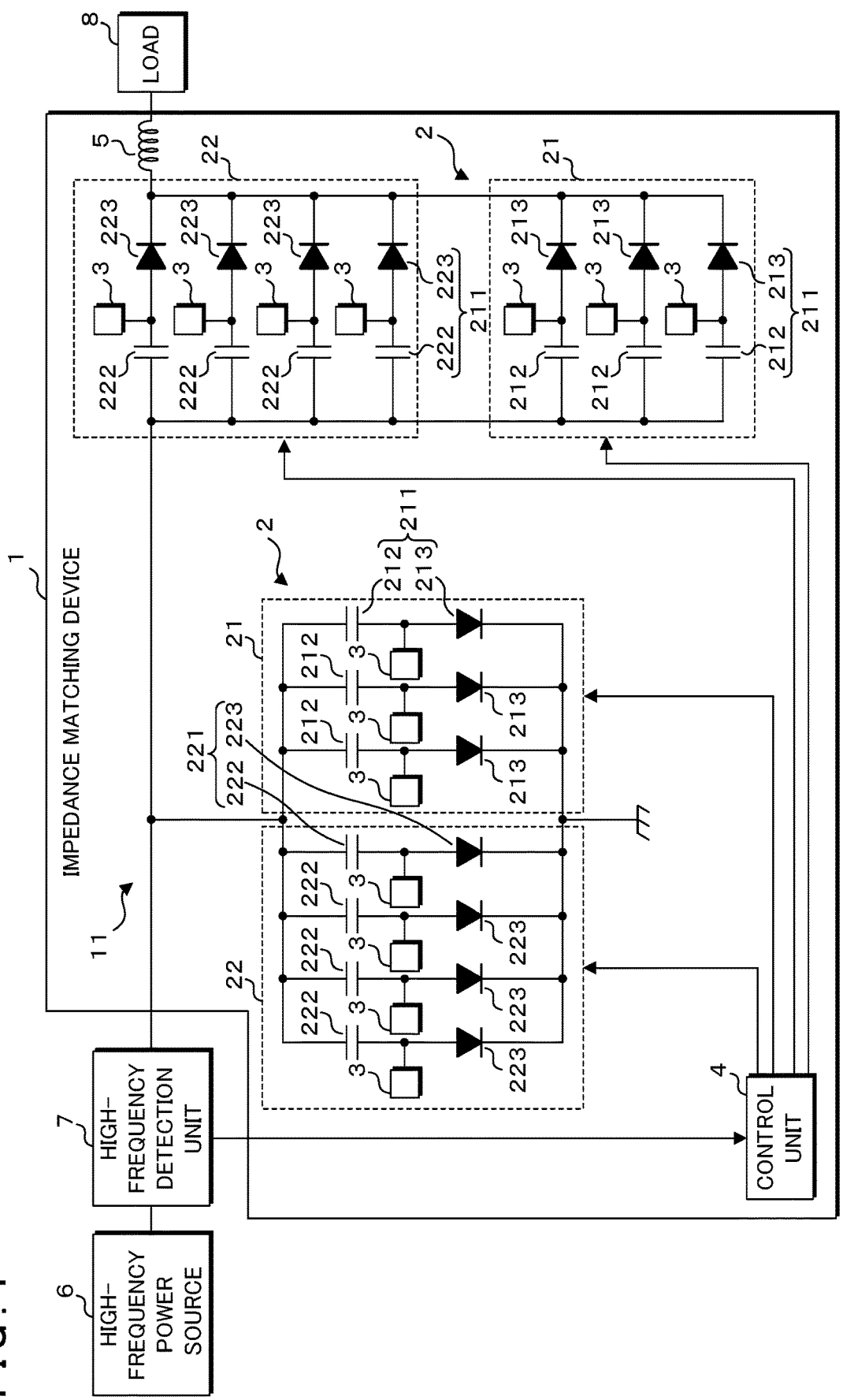
FIG. 1 is a circuit diagram roughly illustrating one example of the configuration of an impedance matching device according to Embodiment 1.

The present invention will be described below with reference to the drawings depicting embodiments thereof. FIG.

1 is a circuit diagram roughly illustrating one example of the configuration of an impedance matching device 1 according to Embodiment 1. The impedance matching device 1 is connected between a high-frequency power source 6 and a load 8. Between the high-frequency power source 6 and the impedance matching device 1, a high-frequency detection unit 7 is provided. That is, the high-frequency detection unit 7 is provided between the output terminal of the high-frequency power source 6 and the input terminal of the impedance matching device 1. The impedance matching device 1 obtains information concerning an impedance (load-side impedance) viewed from the high-frequency power source 6 toward the load 8 side that is detected by the high-frequency detection unit 7, and matches the impedance viewed from the high-frequency power source 6 toward the load 8 side to the output impedance of the high-frequency power source 6 (makes the load-side impedance and the output impedance of the high-frequency power source 6 conjugate with each other) based on the information.

The high-frequency power source 6 is an alternating current (AC) power source that outputs high-frequency power at the radio frequency (RF) band, for example, of 2 MHz, 13.56 MHz, 27 MHz or 60 MHz or the like, and has output an impedance set to a predetermined value such as 50Ω, for example. The high-frequency power source 6 includes an inverter circuit (not illustrated), and performs switching control of the inverter circuit at high speeds to thereby generate AC power at high frequencies and outputs the generated AC power to the load 8.

The load 8 is for performing various processing using the high-frequency power input from the high-frequency power source 6 and includes, for example, a plasma processing apparatus, contactless power transfer device, or the like. In the plasma processing apparatus, the state of the plasma varies with time as the manufacturing process such as plasma etching, plasma CVD, etc. advances. This varies the impedance of the load 8. In order to efficiently supply power to the load 8 from the high-frequency power source 6, the impedance (load-side impedance) viewed from the high-frequency power source 6 toward the load 8 side needs to be adjusted as the impedance of the load 8 varies.

The high-frequency detection unit 7 detects parameters used for calculating the load-side impedance, which is an impedance viewed from the output terminal of the high-frequency power source 6 or from the input terminal of the impedance matching device 1 equivalent to the output terminal of the high-frequency power source 6 toward the load 8 side. The parameters are derived using high-frequency voltage and high-frequency current that are supplied from the high-frequency power source 6 to the load 8 as well as a phase difference between the high-frequency voltage and the high-frequency current, for example. The parameters include forward wave voltage, reflected wave voltage, forward wave current, reflected wave current, forward wave power and reflected wave power that are detected at the connection node between the high-frequency detection unit 7 and the impedance matching device 1 or at the output terminal of the high-frequency power source 6, or include a reflection coefficient derived by using the forward wave voltage, etc. and the reflected wave voltage, etc. The matter concerning the reflection coefficient is based on a known art (Japanese Patent Application Laid-Open No. 2014-236435), for example. The parameters include transmission parameters (T parameters) or scattering parameters (S parameters) as disclosed in a known document (Japanese Patent Application Laid-Open No. 2006-166412). The high-frequency detection unit 7 corresponds to an impedance detection unit that detects information concerning the impedance (load-side impedance) viewed from the high-frequency power source 6 toward the load 8 side. Note that the load-side impedance corresponds to a complex impedance of the impedance of the load 8 and the impedance of the impedance matching device 1, and thus the impedance of the load 8 may be derived by subtracting the impedance of the impedance matching device 1 from the load-side impedance.

The impedance matching device 1 includes two variable capacitors 2, an inductor 5, driving circuits 3 and a control unit 4. The impedance matching device 1 changes the capacitance of the variable capacitors 2 based on the information concerning the load-side impedance detected by the high-frequency detection unit 7 and adjusts the load-side impedance, to thereby achieve impedance matching.

In the impedance matching device 1, one of the variable capacitors 2 has one end connected to the high-frequency power source 6 via the high-frequency detection unit 7 and the other end connected to the ground (grounded). The other one of the variable capacitors 2 is connected to the one variable capacitor 2 in parallel and has one end connected to the high-frequency power source 6 via the high-frequency detection unit 7 and the other end connected to the load 8. Between the other variable capacitor 2 and the load 8, the inductor 5 is connected in series. That is, the connection between the variable capacitor 2 and the high-frequency power source 6 is not limited to the direct connection and includes indirect connection via the high-frequency detection unit 7 or the like as well. These two variable capacitors 2 and the inductor 5 constitute a reverse L-shaped matching circuit 11. Note that the matching circuit 11 may be, though not limited to the reverse L-shaped matching circuit 11, a π typed matching circuit 11 in which two variable capacitors 2 each having one end connected to the high-frequency power source 6 and the other end connected to the ground (grounded) are provided so as to be connected in parallel.

The variable capacitors 2 each include a first capacitance element group 21 and a second capacitance element group 22. The first capacitance element group 21 includes multiple first capacitance elements 211 that are connected in parallel to each other. The first capacitance elements 211 each include a higher-order bit capacitor 212 that has one end connected to the high-frequency power source 6 side and a higher-order bit switch 213 that is connected in series to the other end of the higher-order bit capacitor 212. The capacitances of the respective higher-order bit capacitors 212 are set to the same.

The higher-order bit switch 213 is, for example, a PIN diode having the anode connected to the high-frequency power source 6 side and the cathode connected to the ground side. To the connection node between the anode of the PIN diode and the other end of the higher-order bit capacitor 212, an electric wire to which DC voltage from the driving circuit 3 as described below is output is connected. The DC voltage output from the driving circuit 3 is applied in a forward direction between the anode and the cathode of the PIN diode, to thereby turn the PIN diode to the on state. The higher-order bit switch 213 formed by the PIN diode is turned to the on state, to thereby allow high-frequency current to bidirectionally flow through the higher-order bit switch 213. Furthermore, the higher-order bit switch 213 is turned to the on state to thereby allow the higher-order bit capacitor 212 connected in series to the higher-order bit switch 213 to work. Depending on the number of higher-order bit switches 213 that are turned to the on state, the capacitance of the first capacitance element group 21 (the capacitance of the single higher-order bit capacitor 212*the number of higher-order bit switches 213 that are turned to the on state) can be adjusted.

The second capacitance element group 22 includes multiple second capacitance elements 221 that are connected in parallel to each other. The second capacitance elements 221 each include a lower-order bit capacitor 222 having one end connected to the high-frequency power source 6 side and a lower-order bit switch 223 connected in series to the other end of the lower-order bit capacitor 222.

The capacitances of the respective lower-order bit capacitors 212 are set to be different from each other in a stepwise manner. Out of the lower-order bit capacitors 222, the lower-order bit capacitors 222 other than the lower-order bit capacitor 222 with the smallest capacitance (the smallest capacitor) are set to values obtained by multiplying the capacitance of the smallest capacitor by powers of two. The details of the relationship between the capacitances of the respective lower-order bit capacitors 222 and the capacitances of the higher-order bit capacitors 212 or the like will be described later.

Similarly to the higher-order bit switch 213, the lower-order bit switch 223 is a PIN diode having the anode connected to the high-frequency power source 6 side and the cathode connected to the ground side, and is turned to the on state in response to the DC voltage output from the driving circuit 3. The lower-order bit switch 223 is turned to the on state to thereby allow the lower-order bit capacitor 222 connected in series to the lower-order bit switch 223 to work. Depending on the states of the lower-order bit switches 223 that are turned to the on state, the capacitance of the second capacitance element group 22 (the total value of the capacitances of the lower-order bit capacitors 222 that are turned to the on state) can be adjusted.

It is noted that in the present embodiment, three first capacitance elements 211 included in the first capacitance element group 21 are provided while four second capacitance elements 221 included in the second capacitance element group 22 are provided. The number of capacitance elements may however take any number, not limited to the above. In some embodiments, two or more first capacitance elements 211 may be provided while two or more second capacitance elements 221 may be provided. In FIG. 1, the variable capacitor 2 is constituted by, though not limited to, the first capacitance element group 21 and the second capacitance element group 22. The variable capacitor 2 may include a capacitance element other than the first capacitance element group 21 and the second capacitance element group 22. In FIG. 1, the impedance matching device 1 is configured to include two variable capacitors 2 in order to adjust the capacitance though the number of variable capacitors 2 may however take any number, not limited to the above. The impedance matching device 1 may include one, or three or more variable capacitors 2 and further include a capacitor with a fixed capacitance, in order to adjust the capacitance.

Figure 2:
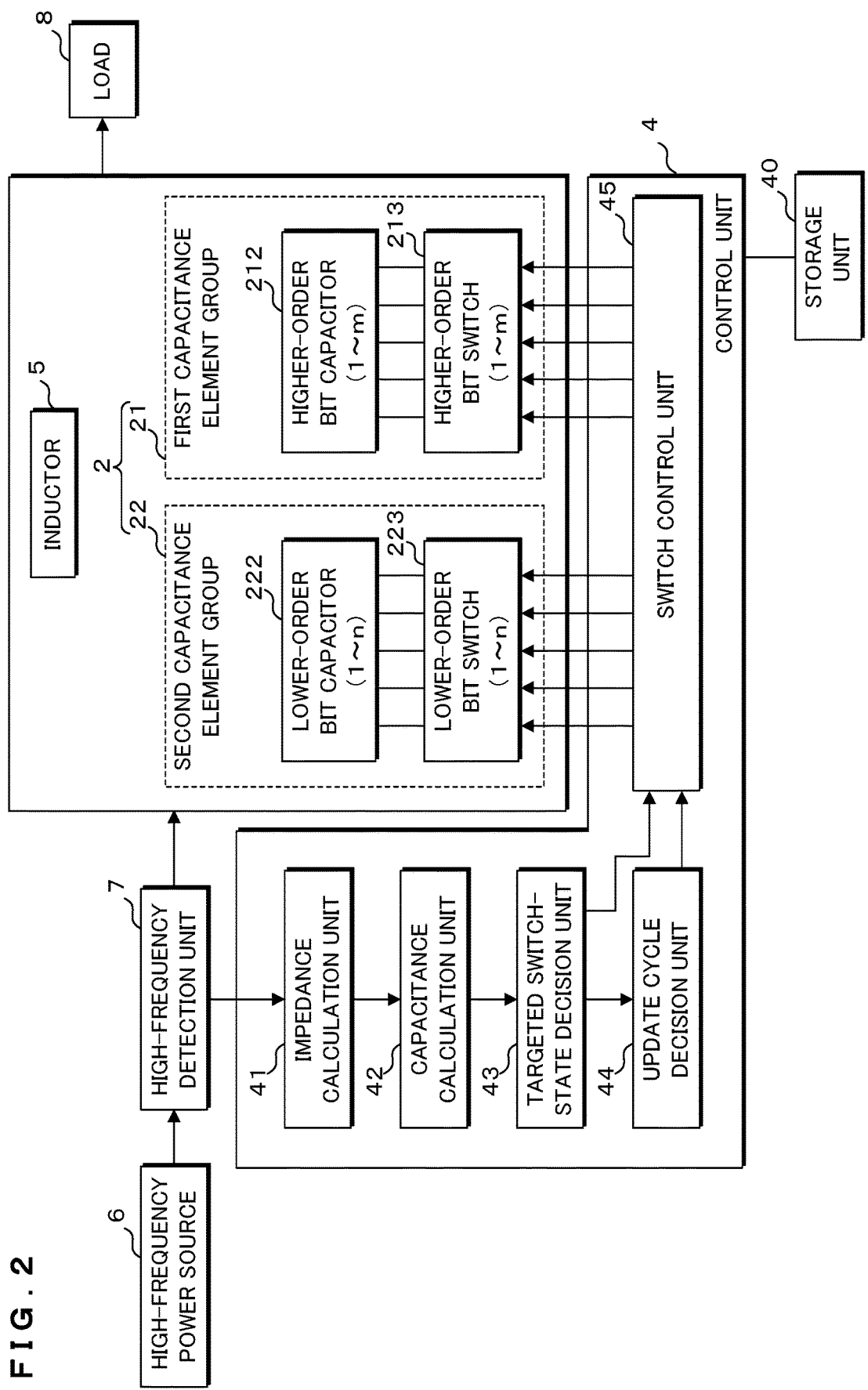
FIG. 2 is a block diagram roughly illustrating one example of the configuration of a control unit.

FIG. 2 is a block diagram roughly illustrating one example of the configuration of the control unit 4. The control unit 4 is constituted by a central processing unit (CPU), a micro processing unit (MPU) or the like, and has a clock function and a calculation function. The control unit 4 is connected to a storage unit 40 such as a read only memory (ROM), a random access memory (RAM) or the like through an internal bus or the like, and executes a program stored in the storage unit 40 to thereby function as an impedance calculation unit 41, a capacitance calculation unit 42, a targeted switch-state decision unit 43 and an update cycle decision unit 44. The control unit 4, which includes a switch control unit 45, obtains information concerning the impedance (load-side impedance) viewed from the high-frequency power source 6 toward the load 8 side that is detected by the high-frequency detection unit 7 and controls the switch control unit 45 based on the information to thereby adjust the capacitance of the variable capacitor 2, achieving the impedance matching.

The impedance calculation unit 41 is a function unit for obtaining information concerning the impedance viewed from the high-frequency power source 6 toward the load 8 side that is detected and output by the high-frequency detection unit 7 or the parameters including the information at a predetermined cycle to thereby calculate the impedance viewed from the high-frequency power source 6 toward the load 8 side as a load-side impedance. The cycle (calculation cycle) for calculating the load-side impedance is, for example, 100 μsec to 1 msec.

The capacitance calculation unit 42 is a function unit for calculating the capacitance required for the variable capacitor 2 in order to match the load-side impedance calculated by the impedance calculation unit 41 to the output impedance of the high-frequency power source 6.

The targeted switch-state decision unit 43 is a function unit for deciding the on or off state of the respective PIN diodes (the higher-order bit switch 213 or the lower-order bit switch 223, or the higher-order bit switch 213 and the lower-order bit switch 223) included in the variable capacitor 2 in order to match the capacitance of the variable capacitor 2 to the capacitance calculated by the capacitance calculation unit 42.

The update cycle decision unit 44 is a function unit for deciding the cycle (update cycle) to update the state of the higher-order bit switch 213 or the lower-order bit switch 223 based on the state of the higher-order bit switch 213 or the lower-order bit switch 223. The update cycle is, for example, 100 μsec to 5 msec, and the update cycle may be equalized with the load-side impedance calculation cycle (calculation cycle). The details of the update cycle decision unit 44 will be described later using the flowchart, which will be described later.

Figure 3:
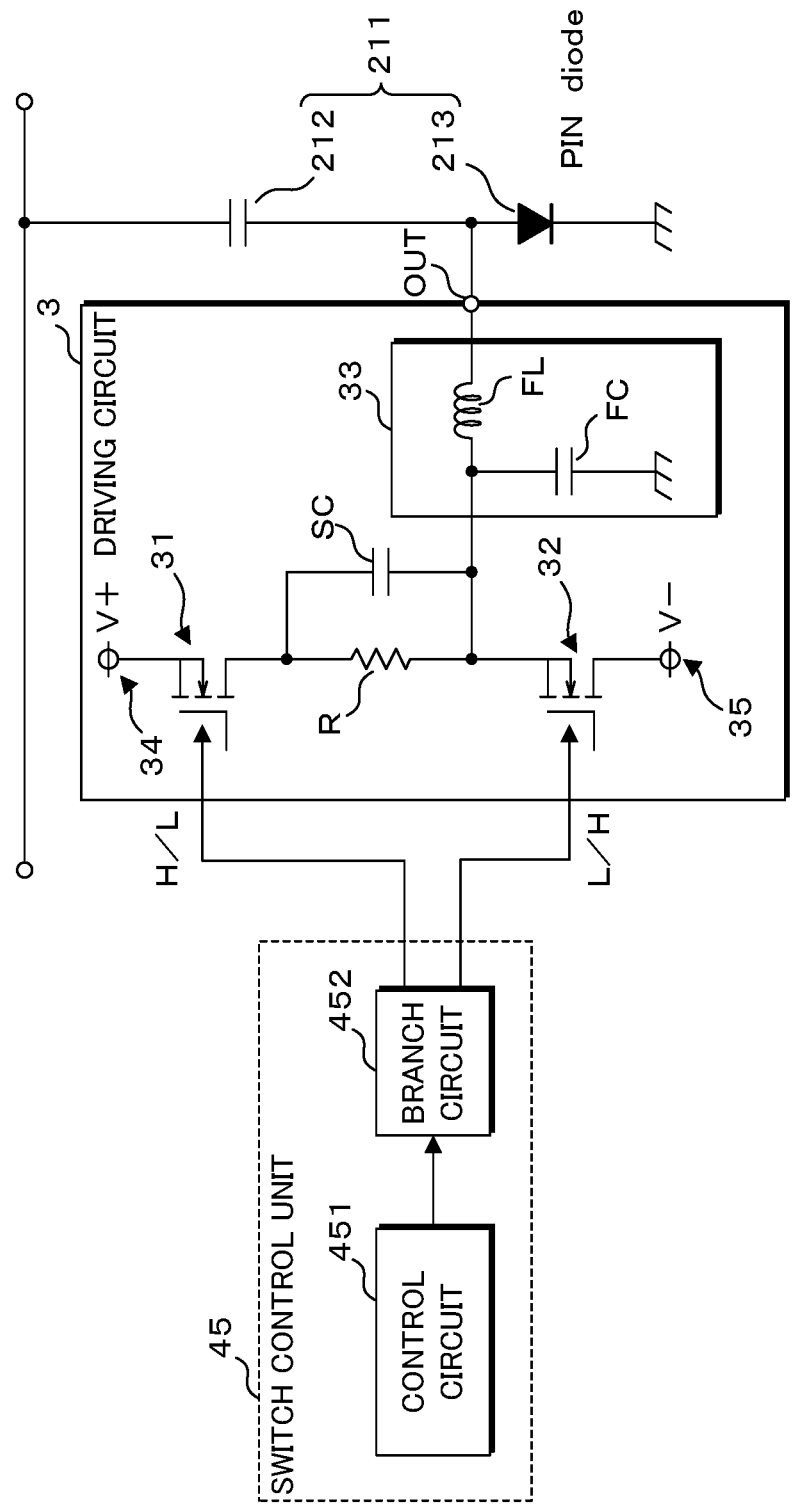
FIG. 3 is a circuit diagram roughly illustrating one example of the configuration of a driving circuit.

The switch control unit 45 includes a control circuit 451 and a branch circuit 452 (see FIG. 3). The switch control unit 45 updates the state of the higher-order bit switch 213 or the lower order bit switch 223, or the states of the higher-order bit switch 213 and the lower-order bit switch 223 at the update cycle decided by the update cycle decision unit 44. The switch control unit 45 outputs to the driving circuit 3 an on-off signal for updating the state of the higher-order bit switches 213 or the lower-order bit switches 223 based on the state of the higher-order bit switch 213 or the lower-order bit switch 223 decided by the targeted switch-state decision unit 43, and updates the state of the higher-order bit switch 213 or the lower-order bit switch 223.

FIG. 3 is a circuit diagram roughly illustrating one example of the configuration of the driving circuit 3. The driving circuit 3 is provided for each of the higher-order bit switches 213 or each of the lower-order bit switches 223 as illustrated in FIG. 1. It is noted that FIG. 3 mainly illustrates the first capacitance element 211.

The one end of the driving circuit 3 is connected to the connection node between the higher-order bit capacitor 212 or the lower-order bit capacitor 222 and the anode of the PIN diode (the higher-order bit switch 213 or the lower-order bit switch 223). The other end of the driving circuit 3 is connected to the switch control unit 45 included in the control unit 4. The driving circuit 3 outputs DC voltage from the one end based on a control signal output from the switch control unit 45 and applies the DC voltage in a forward direction of the PIN diode (the higher-order bit switch 213 or the lower-order bit switch 223).

The driving circuit 3 includes a high-side switch 31 and a low-side switch 32. The high-side switch 31 and the low-side switch 32 are semiconductor switches, for example, n-type metal-oxide-semiconductor field-effect transistors (MOSFETs), insulated gate bipolar transistors (IGBTs) or the like.

The source of the high-side switch 31 and the drain of the low-side switch 32 are connected in series, and the connection node between the high-side switch 31 and the low-side switch 32 as well as the connection node between the PIN diode and the higher-order bit capacitor 212 or the lower-order bit capacitor 222 are connected by an electric wire (output line). The output line is provided with a filter circuit 33 (low-pass filter) constituted by a capacitor FC and a coil FL. Between the high-side switch 31 and the connection node of the high-side switch 31 and the low-side switch 32, a resistor R and a speed-up capacitor SC are connected in parallel. The drain of the high-side switch 31 is connected to the positive output terminal 34 of the driving source (V). The source of the low-side switch 32 is connected to the negative output terminal 35 of the driving source (V). The respective gate terminals of the high-side switch 31 and the low-side switch 32 are connected to two signal lines extending from the switch control unit 45.

The switch control unit 45 includes the control circuit 451 and the branch circuit 452, and outputs a control signal for complementary turning on or off the high-side switch 31 and the low-side switch 32 to signal lines divided into two branches at the branch circuit 452. In other words, based on the control signal output from the control circuit 451, the branch circuit 452 generates two voltage signals that are opposite to each other between the high level (H) and the low-level (L) to output the one voltage signal to the high-side switch 31 and the other voltage signal to the low-side switch 32. The high-side switch 31 to which a high level (H) voltage signal is input is turned to the on state while the low-side switch 32 to which a low level (L) voltage signal is input is turned to the off state. Alternatively, the high-side switch 31 to which a low level (L) voltage signal is input is turned to the off state while the low-side switch 32 to which a high level (H) voltage signal is input is turned to the on state. Hence, the high-side switch 31 and the low-side switch 32 are complementary controlled so as to be in the on or off state, so that one of the switches is in the on state while the other is in the off state.

When the high-side switch 31 is in the on state (the low-side switch 32 is in the off state), the positive side (V+) of the driving source and the anode of the PIN diode are connected to each other, so that DC voltage in the forward direction (voltage necessary for causing current in the forward direction to flow) is applied to the anode of the PIN diode, turning the PIN diode to the on state. When the high-side switch 31 is in the off state (the low-side switch 32 is in the on state), the negative side (V−) of the driving source and the anode of the PIN diode are connected to each other, so that negative voltage (voltage in a rage where breakdown voltage does not occur) is applied to the anode of the PIN diode, turning the PIN diode to the off state.

FIG. 4 is an illustrative view of the first capacitance element group 21. FIG. 5 is an illustrative view of the second capacitance element group 22. In the present embodiment, the first capacitance element group 21 of the variable capacitor 2 includes three first capacitance elements 211 while the second capacitance element group 22 includes four second capacitance elements 221. It is understood that the number of first capacitance elements 211 and the number of second capacitance elements 221 are not limited to the above-mentioned exemplified numbers.

The capacitances of the higher-order bit capacitors 212 (HCs 1-3) of the respective three first capacitance elements 211 are all the same value of 16 pF. The higher-order bit capacitors 212 are connected in parallel, so that the total value of the capacitances of the higher-order bit capacitors 212 for which corresponding higher-order bit switches 213 are turned on is the capacitance of the first capacitance element group 21. It is noted that the same capacitance value does not necessarily mean that the capacitances are not required to be strictly the same, and a margin of error within the rated value of the capacitor, for example, may be allowed. That is, when the capacitance of the first capacitance element group 21 is adjusted, the capacitances of the higher-order bit capacitors 212 may take the same value within the allowable range in terms of precision.

The capacitances of the lower-order bit capacitors 222 (LCs 1-4) of the respective four second capacitance elements 221 are different from each other in a stepwise manner. Out of these capacitors 222, the lower-order bit capacitor 222 (hereinafter referred to as the smallest capacitor) with the smallest capacitance has a value of 1 pF, for example. Meanwhile, the capacitances of the other three lower-order bit capacitors 222 are set to increase in a stepwise manner (in binary steps) so as to take values obtained by multiplying the capacitance of the smallest capacitor by the powers of two. As illustrated in FIG. 5, the lower-order bit capacitors 222 are assigned with the number of digits 1 to 4 from the smallest capacitor 222, and the digit numbers are regarded as bit numbers. By combining the on or off state of the lower-order bit capacitors 222 for which capacitances are set in binary steps, the total value (0 to 15 pF) of the capacitances can be adjusted at 16 levels (two to the fourth power). That is, assuming that the capacitance of the smallest capacitor is Cmin [pF] and the number of lower-order bit capacitors 222 is n, the capacitance Ck of the lower-order bit capacitor 222 whose digits in number (bit number) is k (here, 1≤K≤n) is represented by a value (Ck=Cmin×2(k−1)) obtained by multiplying Cmin by 2 to the power of (k−1). The lower-order bit capacitors 222 are connected in parallel to each other, so that the total value of the capacitances of the lower-order bit capacitors 222 for which corresponding lower-order bit switches 223 are turned on is the capacitance of the second capacitance element group 22. The capacitances of the lower-order bit capacitors 222 are set in binary steps, and thus the respective bits are represented by 1 or 0, so that the capacitance of the second capacitance element group 22 can be adjusted at each step of 2 to the power of n (n: the number of lower-order bit capacitors 222).

The capacitance of the variable capacitor 2 is the total value of the capacitance of the first capacitance element group 21 and the capacitance of the second capacitance element group 22. The capacitance of a single higher-order bit capacitor 212 is set to a value larger than the total value of the capacitances of all the lower-order bit capacitors 222. Moreover, the capacitance of each of the higher-order bit capacitors 212, that is, the capacitance of a single higher-order bit capacitor 212 is set to a value obtained by multiplying the capacitance of the smallest capacitor by 2 to the power of n (n: the number of lower-order bit capacitors 222). The capacitance of the higher-order bit capacitors 212 and the lower-order bit capacitors 222 are thus set, and even if the capacitance required for the variable capacitor 2 exceeds the total value of the capacitances of all the lower-order bit capacitors 222, this can be addressed by turning the higher-order bit switch 213 to the on state. In the present embodiment, if the required capacitance is 18 pF, for example, this can be addressed by combining one higher-order bit capacitor 212 (16 pF) and the lower-order bit capacitor 222 (2 pF) corresponding to 2 bits. The capacitance of each of the higher-order bit capacitors 212, that is, the capacitance of a single higher-order bit capacitor 212 is set to a value obtained by multiplying the capacitance of the smallest capacitor by 2 to the power of n (n: the number of lower-order bit capacitors 222). Hence, by combining the higher-order bit capacitors 212 and the lower-order bit capacitors 222, the capacitance of the variable capacitor 2 can be increased in a stepwise manner. It is noted that the capacitance of each of the higher-order bit capacitors 212 is required to be set to a large value to some extent. An excessive large value, however, may complicate the control, and thus a moderate value is more preferable.

Figure 6:
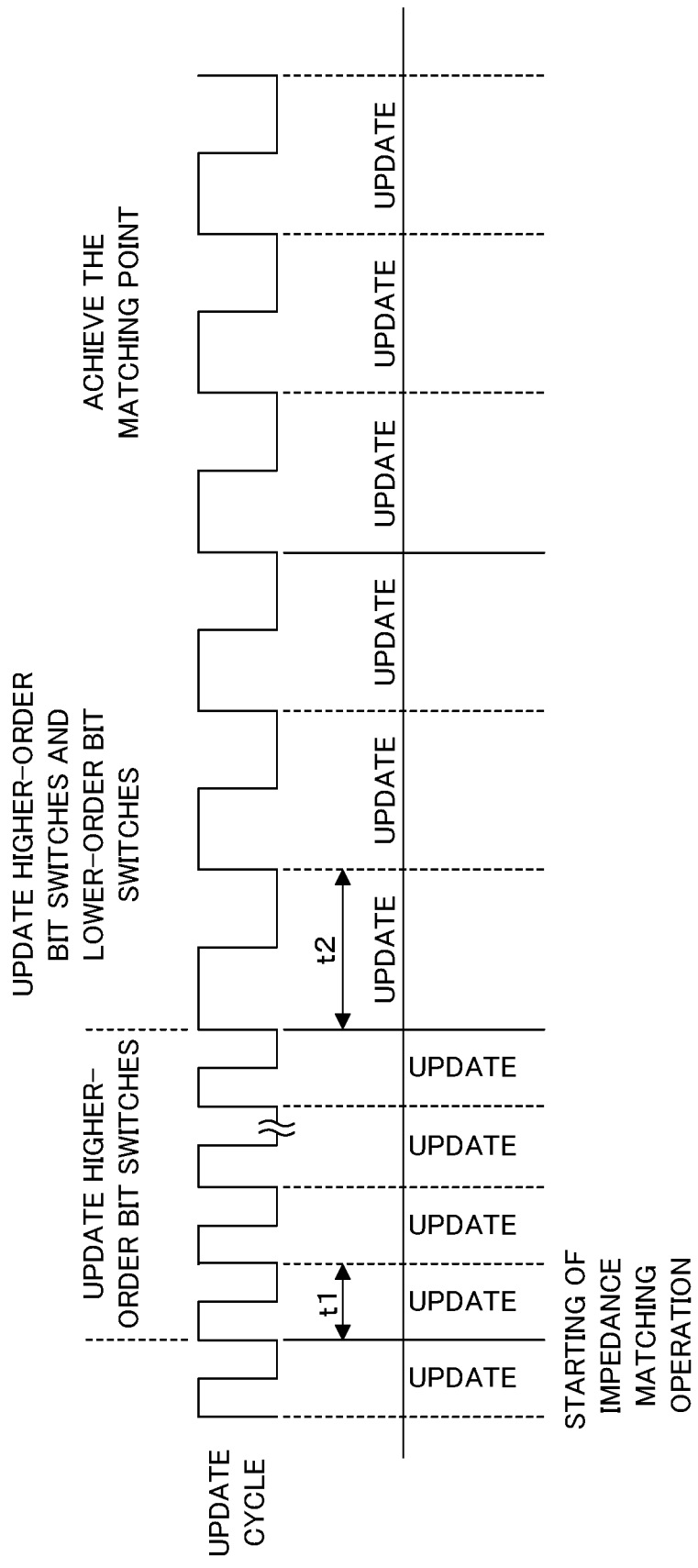
FIG. 6 is an illustrative view of an update cycle of semiconductor switches.

FIG. 6 is an illustrative view of an update cycle of the semiconductor switch. The horizontal axis indicates time while the vertical axis indicates a signal waveform corresponding to the update cycle. The update cycle includes a first cycle (t1) and a second cycle (t2). The first cycle (t1) is set to be shorter than the second cycle (t2) (t1<t2).

The control unit 4 updates each of the higher-order bit switches 213 with the first cycle (t1) directly after starting of impedance matching operation. When updating the higher-order bit switch 213, the control unit 4 outputs a control signal indicating the on or off state of the higher-order bit switch 213 for every first cycle (t1). As illustrated in FIG. 4, in the case where three higher-order bit switches 213 (HC1, HC2, HC3) are provided, the control signal includes information indicating the on or off state corresponding to the three higher-order bit switches 213. For example, in the case where the control signal represents "101," the higher-order bit switch 213 (HC3) is turned on, the higher-order bit switch 213 (HC2) is turned off, and the higher-order bit switch 213 (HC1) is turned on. Alternatively, in the case where the control signal represents "000," all the higher-order bit switches 213 are turned off, while in the case where the control signal represents "111," all the higher-order bit switches 213 are turned on. During updating with the first cycle (t1), the control unit 4 does not output a control signal indicating the on or off state of the lower-order bit switches 223, or continuously outputs a control signal indicating that all the lower-order bit switches 223 are turned off. Accordingly, during updating with the first cycle (t1), the states of the lower-order bit switches 223 are fixed. During updating with the first cycle (t1), the states of the lower-order bit switches 223 are fixed, which enables reduction in the heat generation due to the switching loss of the lower-order bit switches 223.

If a control signal previously output and a control signal currently output are different from each other, the state of any of the higher-order bit switch 213 is changed from the previous time to this time. If a control signal previously output and a control signal currently output are the same, the states of the higher-order bit switches 213 remain unchanged from the previous time to this time. Hence, in the case where the states of the higher-order bit switches 213 are maintained for a predetermined time period, that is, in the case where they are maintained for consecutive multiple updates, the control unit 4 (update cycle decision unit 44) changes the update cycle from the first cycle (t1) to the second cycle (t2). In the case where the load-side impedance is close to a targeted matching point (for example, the reflection coefficient is less than 0.1), by setting the predetermined time period to a period at least three times longer than the first cycle (t1), for example, the control unit 4 can change the update cycle from the first cycle (t1) to the second cycle (t2).

During updating with the second cycle (t2), the control unit 4 outputs control signals indicating the on or off state of the higher-order bit switches 213 and the lower-order bit switches 223 at every second cycle (t2). Even if update is performed multiple times with the second cycle (t2), the states of the higher-order bit switches 213 are generally maintained, enabling reduction in the heat generation due to the switching loss of the higher-order bit switches 213. The second cycle (t2) is longer than the first cycle (t1), and thus the switching count of each of the lower-order bit switches 223 is reduced, enabling reduction in the heat generation due to the switching loss of the lower-order bit switches 223. After the targeted matching point is achieved (for example, the reflection coefficient is less than 0.03), the control unit 4 continues to update the states of the higher-order bit switches 213 and the lower-order bit switches 223 with the second cycle (t2).

Immediately after starting of impedance matching operation, impedance matching operation is performed with the first cycle (t1) with a shorter update cycle by the higher-order bit capacitor 212 having larger capacitance, whereby the targeted matching point can be reached in a short time period while the heat generation of the lower-order bit switches 223 is reduced. In the case where the states of the higher-order bit switches 213 are maintained for a predetermined time or longer, the states of the lower-order bit switches 223 are updated with the second cycle (t2) longer than the first cycle (t1), which eliminates the switching loss of the lower-order bit switches 223, enabling reduction in the heat generation.

Figure 7:
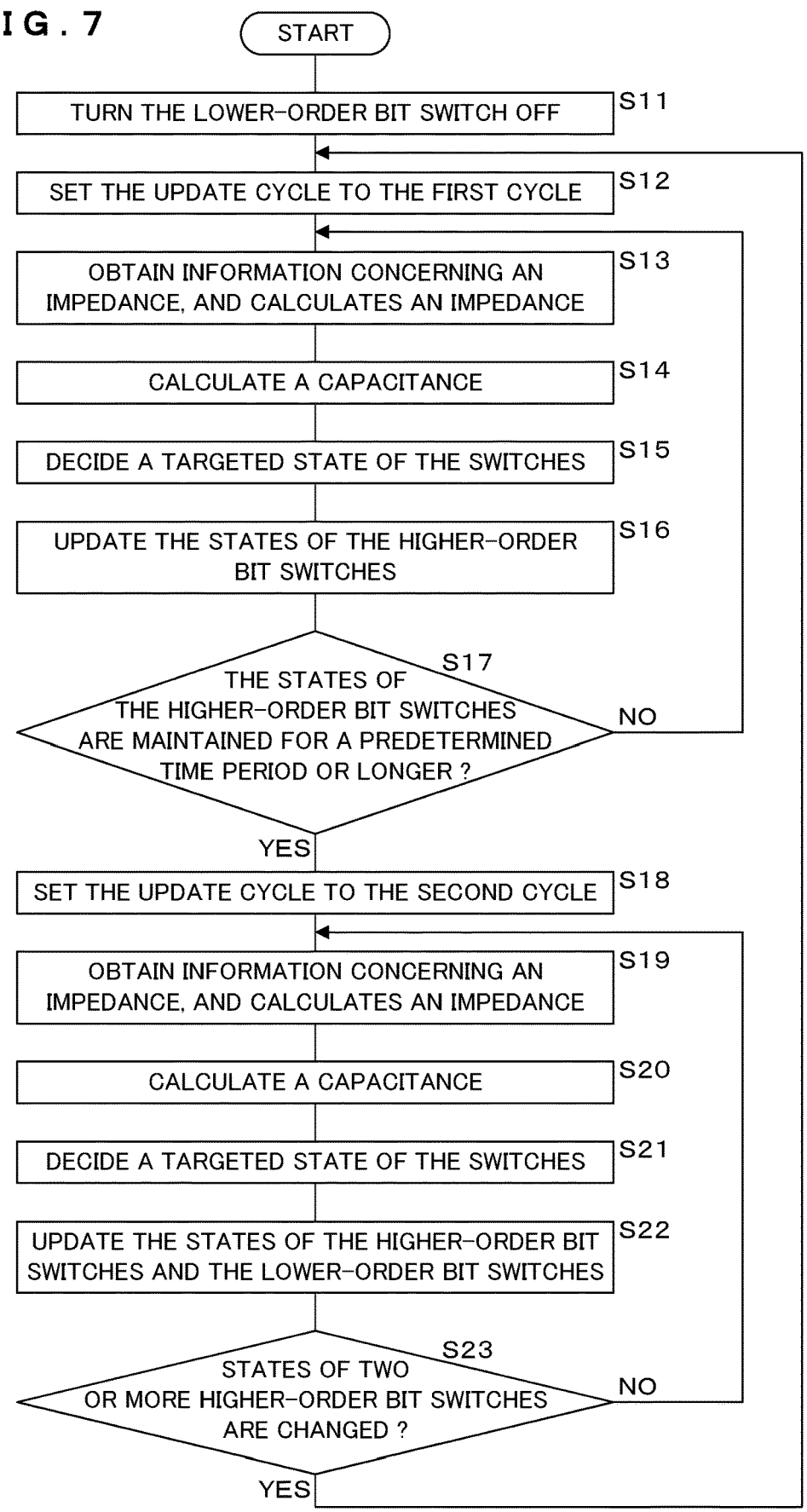
FIG. 7 is a flowchart illustrating processing performed by the control unit according to Embodiment 1.

FIG. 7 is a flowchart illustrating processing performed by the control unit 4 according to Embodiment 1. The control unit 4 of the impedance matching device 1 starts impedance matching operation in response to a matching operation starting instruction, or the like.

The control unit 4 turns the lower-order bit switch 223 off (S11). The control unit 4 turns all the lower-order bit switches 223 of the second capacitance element group 22 included in the variable capacitor 2 to the off state. All the lower-order bit switches 223 are turned to the off state to thereby disable all the lower-order bit capacitors 222 included in the second capacitance element group 22, resulting in 0 pF of the capacitance of the second capacitance element group 22. By turning all the lower-order bit switches 223 to the off state, the heat generation of the lower-order bit switches 223 can be reduced.

The control unit 4 sets the update cycle to the first cycle (S12). The control unit 4 refers to the first cycle stored in advance in the storage unit 40 and sets the first cycle as an update cycle. The processing at step S16, which will be described later, is performed at this first update cycle.

The control unit 4 obtains information concerning an impedance, and calculates an impedance (S13). The control unit 4 obtains information (parameters) concerning the impedance viewed from the high-frequency power source 6 toward the load 8 side that is detected and output by the high-frequency detection unit 7, and calculates an impedance viewed from the high-frequency power source 6 toward the load 8 side as a load-side impedance.

The control unit 4 calculates a capacitance (S14). The control unit 4 calculates the capacitance required for the variable capacitor 2 in order to match the calculated load-side impedance to the output impedance of the high-frequency power source 6.

The control unit 4 decides a targeted state of the switches (S15). The control unit 4 decides the on or off state of the higher-order bit switches 213 and the lower-order bit switches 223 included in the variable capacitor 2 as a targeted state of the switches in order to match the capacitance of the variable capacitor 2 to the capacitance calculated by the capacitance calculation unit 42. Alternatively, the control unit 4 may decide the on or off state of only the higher-order bit switches 213.

The control unit 4 updates the states of the higher-order bit switches 213 (S16). The control unit 4 extracts the states of the higher-order bit switches 213 in the targeted state of the switches decided and updates the on or off state of the higher-order bit switches 213 with the first cycle. The control unit 4 stores the updated on or off state of the higher-order bit switches 213 in the storage unit 40 in association with the time point of updating.

The control unit 4 determines whether or not the states of the higher-order bit switches 213 are maintained for a predetermined time period or longer (S17). The control unit 4 compares the states of the higher-order bit switches 213 at the time when the previous update was performed and the states of the higher-order bit switches 213 at the time when the current update is performed, and determines whether or not these states are equal. If these states are equal to each other, the control unit 4 performs increment processing of increasing a duration counter (initial value is 0) stored in the storage unit 40 by one, for example. If these states are not equal, the control unit 4 sets the duration counter stored in the storage unit 40 to zero to perform initialization. The control unit 4 determines whether or not the duration counter is equal to or more than a predetermined number, e.g., three. If the duration counter is equal to or more than the predetermined number, this means that the states of the higher-order bit switches 213 are maintained over the consecutive predetermined numbers of updates (three consecutive updates). The update cycle is set to the first cycle, and thus in the case where three is set to the predetermined number, the time period during which the states of the higher-order bit switches 213 are maintained corresponds to a time period three times longer than the first cycle. It is noted that the method of deriving the time period during which the states of the higher-order bit switches 213 are maintained is not limited to the above, and the time period during which the states of the higher-order bit switches 213 are maintained may be derived based on the time difference between the previous updating time point and the current updating time point. In this case, the predetermined time period may take a value such as 3 msec, for example, not referring to the first cycle. The information concerning the predetermined time period is stored in the storage unit 40. Every time the higher-order bit switches 213 is updated, the control unit 4 stores the states of the higher-order bit switches 213 and the time point when they are updated in association with each other and stores them in a matrix form, for example, in the storage unit 40. Accordingly, the control unit 4 refers to the storage unit 40 to thereby derive the time period during which the states of the higher-order bit switches 213 are maintained over multiple times of updates.

If the states of the higher-order bit switches 213 are not maintained for the predetermined time period or longer (S17: No), the control unit 4 performs loop processing in order to execute the processing at step S13 again.

If the states of the higher-order bit switches 213 are maintained for the predetermined time period or longer (S17: Yes), the control unit 4 sets the update cycle to the second cycle (S18). The control unit 4 refers to the second cycle stored in the storage unit 40 in advance to thereby set the second cycle as an update cycle. The processing at step S22, which will be described later, is performed with the second cycle.

The control unit 4 performs processing from S19 to S21 similarly to the processing from S13 to S15. It is noted that in the processing at S21, the control unit 4 decides the states of the higher-order bit switches 213 and the lower-order bit switches 223 as a targeted state of the switches.

The control unit 4 updates the states of the higher-order bit switches 213 and the lower-order bit switches 223 (S22). The control unit 4 updates the on or off state of the higher-order bit switches 213 and the lower-order bit switches 223 with the second cycle based on the decided targeted states of the switches. The control unit 4 stores the updated on or off state of the higher-order bit switches 213 and the lower-order bit switches 223 in the storage unit 40 in association with the time point of updating.

The control unit 4 determines whether or not the states of two or more higher-order bit switches 213 are changed (S23). The control unit 4 compares the states of the higher-order bit switches 213 at the time of the previous update with the states of the higher-order bit switches 213 at the time of the current update, and determines whether or not the states of any two or more higher-order bit switches 213 are changed. The states of the higher-order bit switches 213 are stored in the storage unit 4 every updating in association with the updating time point, and thus the control unit 4 compares the states of the higher-order bit switches 213 at the time of the previous update and the states of the higher-order bit switches 213 at the time of the current update by referring to the storage unit 40.

As described above, the total value (15 pF, for example) of the capacitances of all the lower-order bit capacitors 222 is smaller than the capacitance (16 pF, for example) of a single higher-order bit capacitor 212. Accordingly, if the required capacitance of the variable capacitor 2 varies from, for example, 31 pF to 32 pF upon one updating, the number of higher-order bit switches 213 that are to be turned on is increased from one to two, and the lower-order bit switches 223 that are all in the on state are all turned to the off state. Such a phenomenon in which one higher-order bit switch 213 is changed is called carrying (or borrowing). That is, the state of one higher-order bit switch 213 is changed for one updating, however, the amount of change in the required capacitance of the variable capacitor 2 is a small value, and the load-side impedance is close to the matching point. In contrast thereto, in the case where the states of two or more higher-order bit switches 213 are changed, the amount of change in the required capacitance of the variable capacitor 2 is a large value, and the load-side impedance is away from the matching point. When it is determined whether or not the load-side impedance achieves a matched state once and changes to an unmatched state again (a state where the load-side impedance is away from the matching point) by carrying or borrowing, the capacitances of the multiple higher-order bit capacitors 212 in the first capacitance element group 21 are set to the same values as described above.

If the states of the two or more upper-order bit switches 213 are not changed (S23: No), the control unit 4 performs loop processing in order to execute the processing at step S19 again. The control unit 4 performs the loop processing starting from S19 to thereby continuously update the higher-order bit switches 213 and the lower-order bit switches 223 with the second cycle, and adjusts the capacitance of the variable capacitor 2 such that the load-side impedance achieves the matching point. The second cycle is set to a time period at least two to three times longer than the first cycle, for example, to thereby reduce the switching loss of especially the lower-order bit switches 223 and reduce the heat generation thereof.

If the states of the two or more higher-order bit switches 213 are changed (S23: Yes), the control unit 4 performs loop processing in order to execute the processing at S12 again. Here, the load-side impedance is away from the matching point. The control unit 4 sets (returns) the update cycle to the first cycle with a shorter update cycle, and fixes the states of the lower-order bit switches 223 as well as updates the states of the higher-order bit switches 213, which allows the load-side impedance to be close to the matching point soon by the higher-order bit capacitors 212 with large capacitance. During updating with the first cycle, the states of the lower-order bit switches 223 are fixed (maintained), which eliminates the switching loss of the lower-order bit switches 223, enabling reduction in the heat generation.

Modification 1

Figure 8:
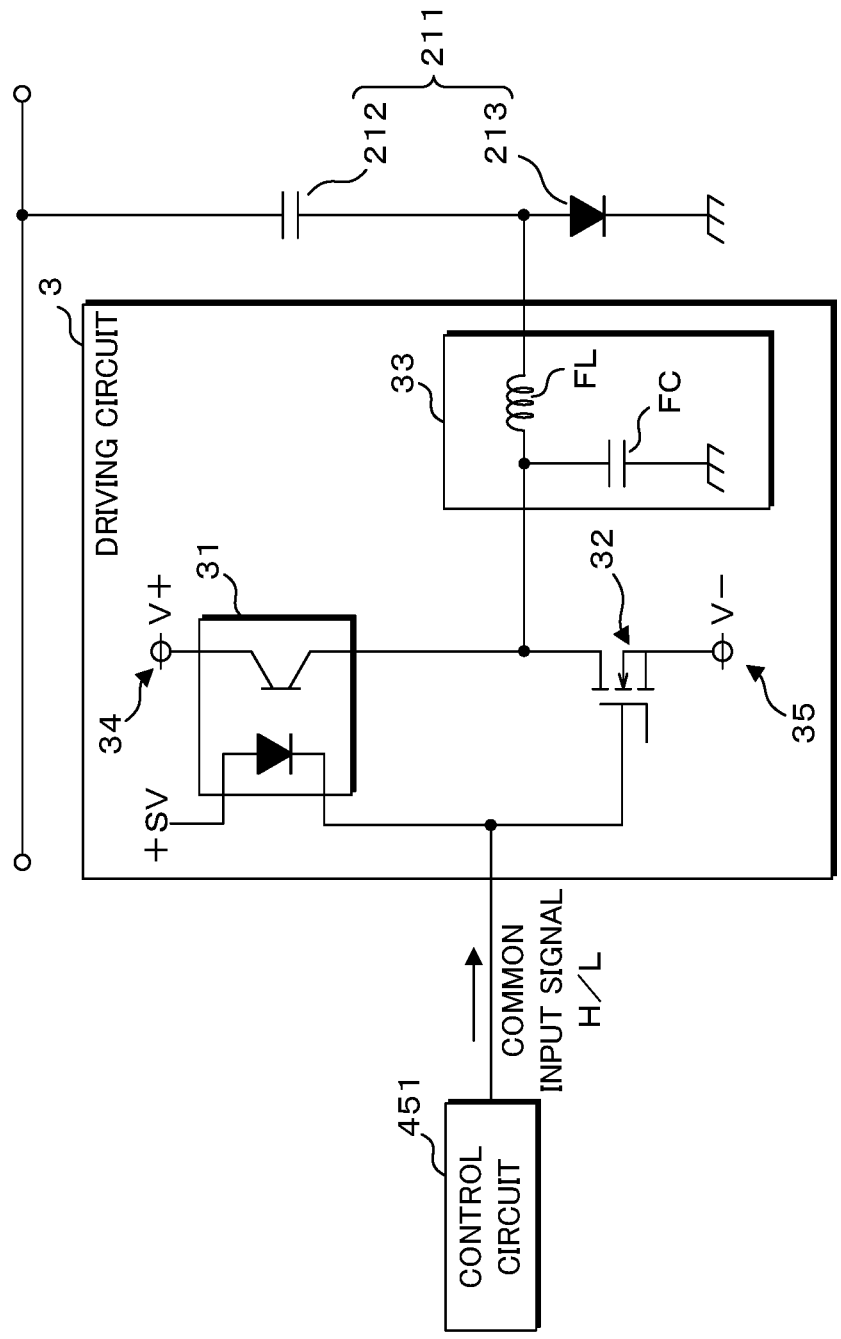
FIG. 8 is a circuit diagram illustrating one example of the configuration of a driving circuit according to Modification 1.

FIG. 8 is a circuit diagram roughly illustrating one example of the configuration of a driving circuit 3 according to Modification 1. It is noted that FIG. 8 mainly illustrates the first capacitance element 211. In Embodiment 1, the control circuit 451 outputs respective two voltage signals that are opposite to each other to the high-side switch 31 and the low-side switch 32, though the signals to be output are not limited thereto. The control circuit 451 may be configured to output a voltage signal (common input signal) common to the high-side switch 31 and the low-side switch 32.

The driving circuit 3 in Modification 1 is provided with a high-side switch 31 and a low-side switch 32 similarly to the driving circuit 3 in Embodiment 1. The high-side switch 31 is constituted by a photocoupler. The low-side switch 32 is constituted by an n-type MOSEFT similarly to Embodiment 1.

Similarly to Embodiment 1, the emitter of the high-side switch (photocoupler) 31 is connected in series to the drain of the low-side switch 32, and the connection node between the high-side switch (photocoupler) 31 and the low-side switch 32 is connected to the connection node between a higher-order bit capacitor 212 or a lower-order bit capacitor 222 and a PIN diode (a higher-order bit switch 213 or a lower-order bit switch 223) by a connection line (output line). The output line is provided with a filter circuit 33 (low-pass filter) constituted by a capacitor FC and a coil FL.

Similarly to Embodiment 1, the collector of the high-side switch (photocoupler) 31 is connected to the positive output terminal 34 of a driving source (V) while the source of the low-side switch (FET) 32 is connected to the negative output terminal 35 of the driving source (V).

The anode of the photodiode of the high-side switch (photocoupler) 31 is connected to a 5-V DC power source, for example, while the cathode thereof is connected to the gate of the low-side switch (FET) 32.

The control circuit 451 included in a switch control unit 45 and the connection point between the cathode of the photodiode and the gate of the low-side switch (FET) 32 are connected by a signal line. The switch control unit 45 outputs a voltage signal (5 V or larger, for example) larger than the output voltage of the DC power source connected to the photodiode as a voltage signal at the high level (H) to thereby turn the high-side switch (photocoupler) 31 to the off state and turn the low-side switch (FET) 32 to the on state. The switch control unit 45 outputs a voltage signal of 0 V as a voltage signal at the low level (L) to thereby turn the high-side switch (photocoupler) 31 to the on state and the low-side switch (FET) 32 to the off state.

The high-side switch (photocoupler) 31 is turned to the on state to thereby turn the PIN diode to the on state. The low-side switch (FET) 32 is turn to the on state to thereby turn the PIN diode to the off state.

In Modification 1 and Embodiment 1 illustrated in FIG. 3, the anode of the PIN diode (the higher-order bit switch 213 or the lower-order bit switch 223) is connected to the higher-order bit capacitor 212 or the lower-order bit capacitor 222 while the cathode thereof is grounded (connected to the ground), though the configuration of the PIN diode is not limited thereto. The anode of the PIN diode (the higher-order bit switch 213 or the lower-order bit switch 223) may be grounded while the cathode thereof may be connected to the higher-order bit capacitor 212 or the lower-order bit capacitor 222. Here, in the case where the positive side (V+) of the driving source is connected to the connection point (cathode of the PIN diode) between the PIN diode and the higher-order bit capacitor 212 or the lower-order bit capacitor 222 (the high-side switch 31 is in the on state and the low-side switch 32 is in the off state), the PIN diode is turned off. In the case where the negative side (V−) of the driving source is connected to the cathode of the PIN diode (the high-side switch 31 is in the off state and the low-side switch 32 is in the on state), the PIN diode is turned on.

Hence, a common input signal being the same voltage signal is output from the control circuit 451 to the high-side switch (photocoupler) 31 and the low-side switch 32 through one signal line, whereby the high-side switch (photocoupler) 31 and the low-side switch 32 can complementary be controlled between on and off. A common input signal is output from the control circuit 451 through one signal line, which eliminates the need for the branch circuit 452 in Embodiment 1.

It is to be understood that the embodiments disclosed here is illustrative in all respects and not restrictive. The scope of the present invention is defined by the appended claims, and all changes that fall within the meanings and the bounds of the claims, or equivalence of such meanings and bounds are intended to be embraced by the claims.

It is to be noted that, as used herein and in the appended claims, the singular forms "a", "an", and "the" include plural referents unless the context clearly dictates otherwise.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims

What is claimed is:

1. An impedance matching device to achieve impedance matching between a high-frequency power source and a load, the impedance matching device comprising:
   a variable capacitor including a plurality of capacitance elements connected in parallel, each of the plurality of capacitance elements respectively having a capacitor with one end connected to the high-frequency power source and a semiconductor switch connected in series to the capacitor, and
   a control unit coupled to an impedance information detection unit located between the power source and the impedance matching device to generate tuning signals that control an on or off state of the each of semiconductor switches so as to match an output impedance of the high-frequency power source and an impedance of the load based on impedance information obtained by the impedance information detection unit,
wherein
the plurality of capacitance elements include a first capacitance element group and a second capacitance element group, the second capacitance element group including capacitors each having a capacitance smaller than a capacitance of one of the capacitors constituting the first capacitance element group, and
the control unit is configured to
start an impedance matching operation between the high-frequency power source and the load,
switch the on or off state of the semiconductor switches included in the first capacitance element group with a first cycle until the on or off state of the semiconductor switches included in the first capacitance element group is maintained for a predetermined time period, and
after the predetermined time period elapses, switch the on or off state of the semiconductor switches included in the first capacitance element group and switch the on or off state of the semiconductor switches included in the second capacitance element group with a second cycle longer than the first cycle.

2. The impedance matching device according to claim 1, wherein
the first capacitance element group includes a plurality of the semiconductor switches, and
the control unit switches the on or off states of the semiconductor switches included in the first capacitance element group with the first cycle in a case where the on or off states of two or more semiconductor switches out of the plurality of the semiconductor switches included in the first capacitance element group are changed during one update cycle after switching with the second cycle.

3. The impedance matching device according to claim 1, wherein the second capacitance element group includes a plurality of the semiconductor switches, and
the control unit maintains the on or off states of the semiconductor switches included in the second capacitance element group at a time of switching with the first cycle.

4. The impedance matching device according to claim 1, wherein the predetermined time period is a time period at least three times longer than the first cycle.

5. The impedance matching device according to claim 1, wherein a capacitance of any one of the capacitors included in the first capacitance element group is larger than a total value of capacitances of all the capacitors included in the second capacitance element group.

6. An impedance matching method of achieving impedance matching between a high-frequency power source and a load by a variable capacitor provided between the high-frequency power source and the load, the variable capacitor including a first capacitance element group including a capacitor and a semiconductor switch and a second capacitance element group including a capacitor having a capacitance smaller than a capacitance of the capacitor of the first capacitance element group and a semiconductor switch, the method comprising:
starting an impedance matching operation between the high-frequency power source and the load,
switching the on or off state of the semiconductor switch included in the first capacitance element group with a first cycle until the on or off state of the semiconductor switch included in the first capacitance element group is maintained for a predetermined time period, and
after the predetermined time period elapses, switching the on or off state of the semiconductor switch included in the first capacitance element group and switching the on or off state of the semiconductor switch included in the second capacitance element group with a second cycle longer than the first cycle.

* * * * *

UNITED STATES PATENT AND TRADEMARK OFFICE
CERTIFICATE OF CORRECTION

| | |
|---|---|
| PATENT NO. | : 11,218,129 B2 |
| APPLICATION NO. | : 16/719343 |
| DATED | : January 4, 2022 |
| INVENTOR(S) | : Morii |

It is certified that error appears in the above-identified patent and that said Letters Patent is hereby corrected as shown below:

In the Claims

Please replace "semiconductor switch included" with -- semiconductor switches included -- in Claim 6 (Column 18, Lines 28-29);

Please replace "semiconductor switch included" with -- semiconductor switches included -- in Claim 6 (Column 18, Lines 30-31);

Please replace "semiconductor switch included" with -- semiconductor switches included -- in Claim 6 (Column 18, Line 34); and Please replace "semiconductor switch included" with -- semiconductor switches included -- in Claim 6 (Column 18, Line 36).

Signed and Sealed this
Third Day of May, 2022

Katherine Kelly Vidal
*Director of the United States Patent and Trademark Office*